(12) United States Patent
Okano

(10) Patent No.: US 9,876,030 B1
(45) Date of Patent: Jan. 23, 2018

(54) SEMICONDUCTOR DEVICE AND METHOD FOR MANUFACTURING SAME

(71) Applicant: TOSHIBA MEMORY CORPORATION, Minato-ku (JP)

(72) Inventor: Kimitoshi Okano, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/376,019

(22) Filed: Dec. 12, 2016

Related U.S. Application Data

(60) Provisional application No. 62/378,931, filed on Aug. 24, 2016.

(51) Int. Cl.
*H01L 29/78* (2006.01)
*H01L 27/11582* (2017.01)
*H01L 27/11556* (2017.01)
*H01L 23/528* (2006.01)
*H01L 23/532* (2006.01)

(52) U.S. Cl.
CPC .... *H01L 27/11582* (2013.01); *H01L 23/5283* (2013.01); *H01L 23/53257* (2013.01); *H01L 27/11556* (2013.01)

(58) Field of Classification Search
CPC ........... H01L 23/5283; H01L 23/53257; H01L 27/2481
See application file for complete search history.

(56) References Cited

U.S. PATENT DOCUMENTS

| | | | | |
|---|---|---|---|---|
| 6,344,675 B1* | 2/2002 | Imai | .................. | H01L 29/41733 257/347 |
| 8,749,067 B2* | 6/2014 | Zhao | ................. | H01L 21/76847 257/751 |
| 8,946,665 B2 | 2/2015 | Shim et al. | | |
| 2003/0045039 A1* | 3/2003 | Shin | .................. | H01L 21/28518 438/197 |
| 2005/0101076 A1* | 5/2005 | Nakabayashi | ........ | H01L 27/105 438/199 |

(Continued)

FOREIGN PATENT DOCUMENTS

| | | |
|---|---|---|
| JP | 2012-4473 | 1/2012 |
| JP | 2012-142556 | 7/2012 |
| JP | 2014-22729 | 2/2014 |

*Primary Examiner* — Sitaramarao S Yechuri
(74) *Attorney, Agent, or Firm* — Oblon, McClelland, Maier & Neustadt, L.L.P.

(57) ABSTRACT

A semiconductor device comprises a channel body, a pair of source drain regions provided on the channel body and a gate electrode provided above a part of the channel body between the source drain regions. The semiconductor device further comprises a first insulating layer covering the source drain regions and the gate electrode; contact bodies extending in the first insulating layer electrically connected to the source drain regions respectively; and a silicide layer provided between one of the source drain regions and one of the contact bodies electrically connected thereto. The one of the contact bodies includes a main part extending in the first insulating layer, and an expanded portion expanded along a surface of the one of the source drain regions; and the silicide layer is positioned between the expanded portion and the one of the source drain regions.

12 Claims, 13 Drawing Sheets

(56) References Cited

U.S. PATENT DOCUMENTS

| | | | |
|---|---|---|---|
| 2008/0099921 A1* | 5/2008 | Katata | H01L 21/76877 257/751 |
| 2009/0140325 A1* | 6/2009 | Kim | H01L 21/26506 257/324 |
| 2009/0267139 A1* | 10/2009 | Maejima | H01L 27/0688 257/326 |
| 2010/0025773 A1* | 2/2010 | Lenoble | H01L 21/26506 257/382 |
| 2012/0168858 A1 | 7/2012 | Hong | |
| 2013/0285137 A1* | 10/2013 | Pendharkar | H01L 29/87 257/328 |

* cited by examiner

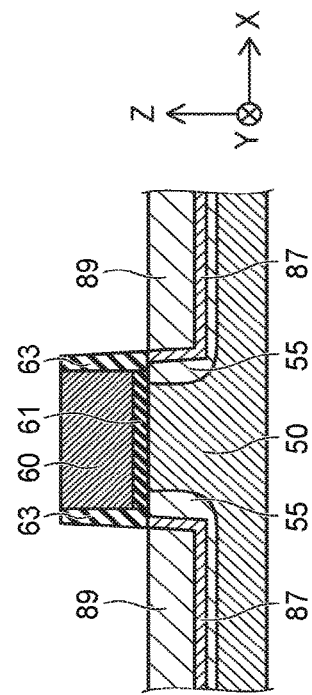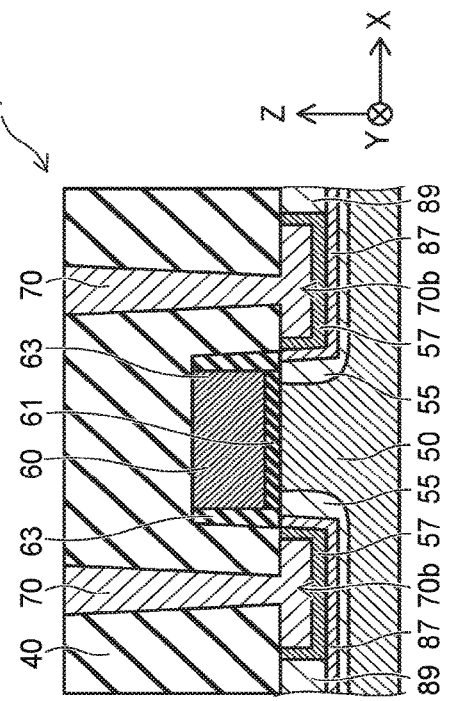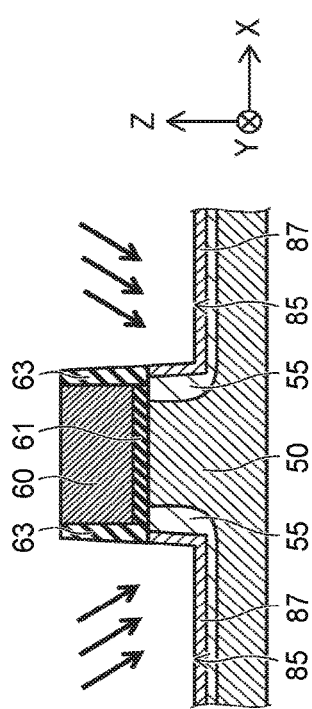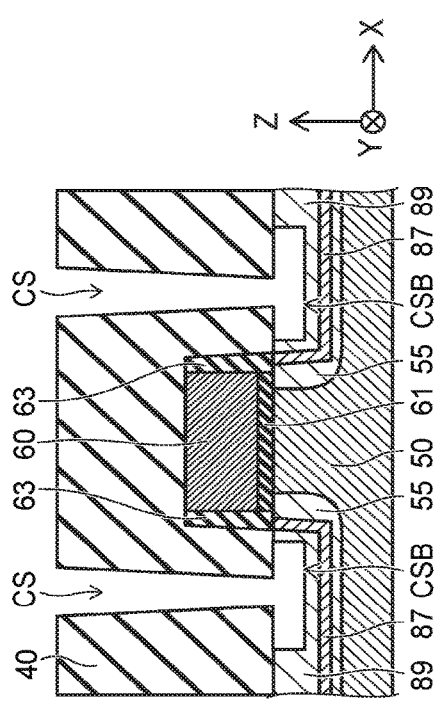

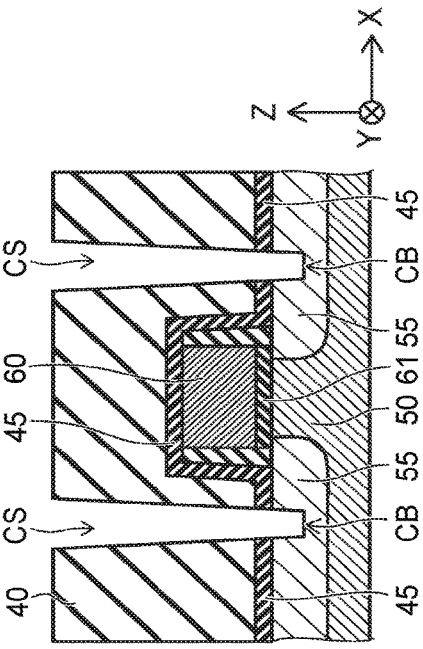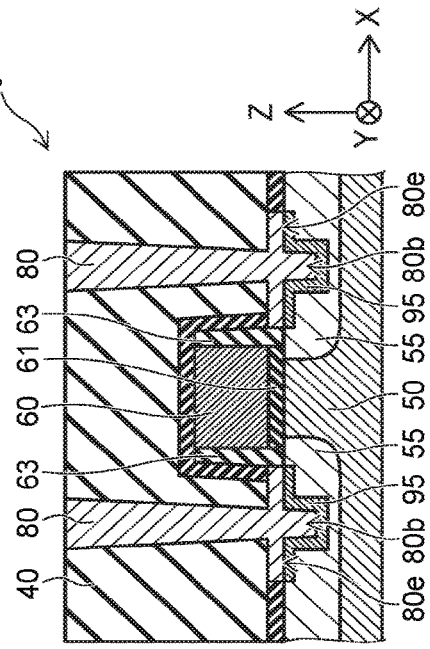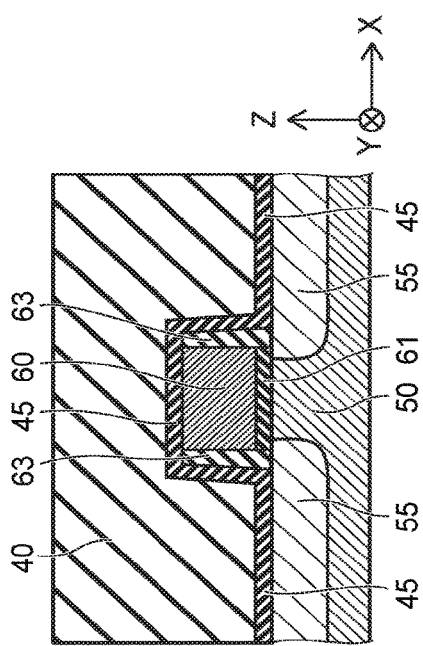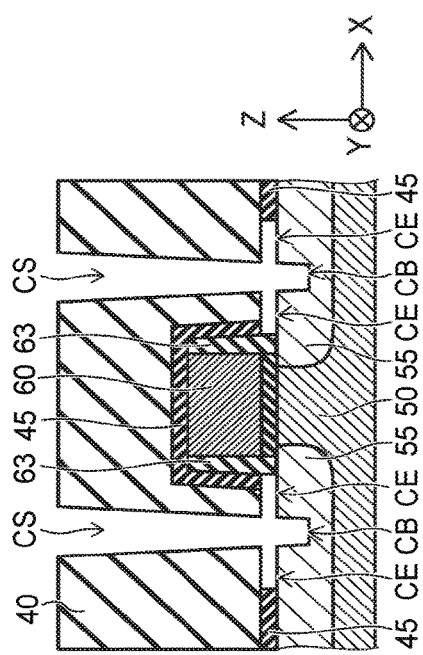

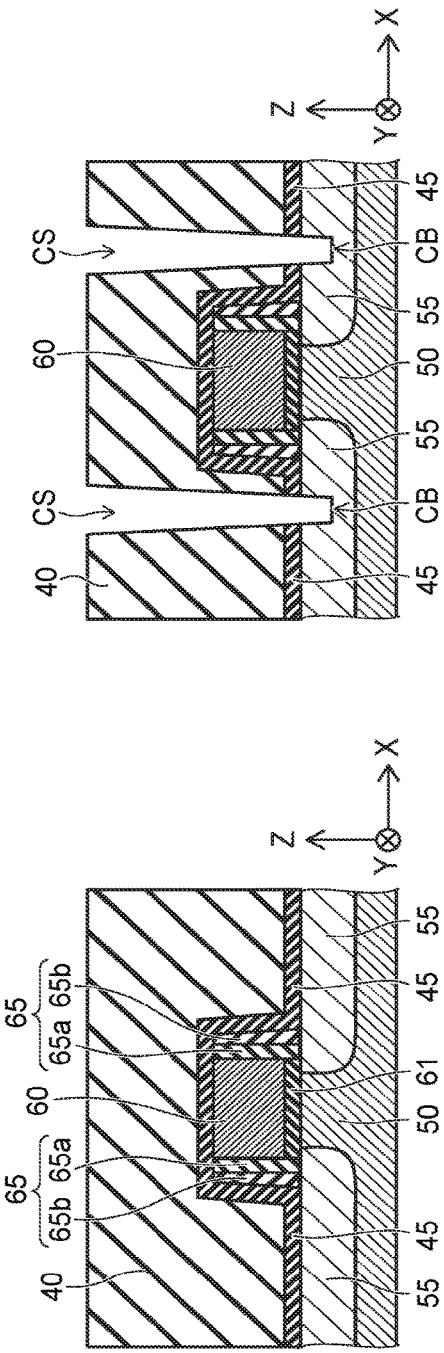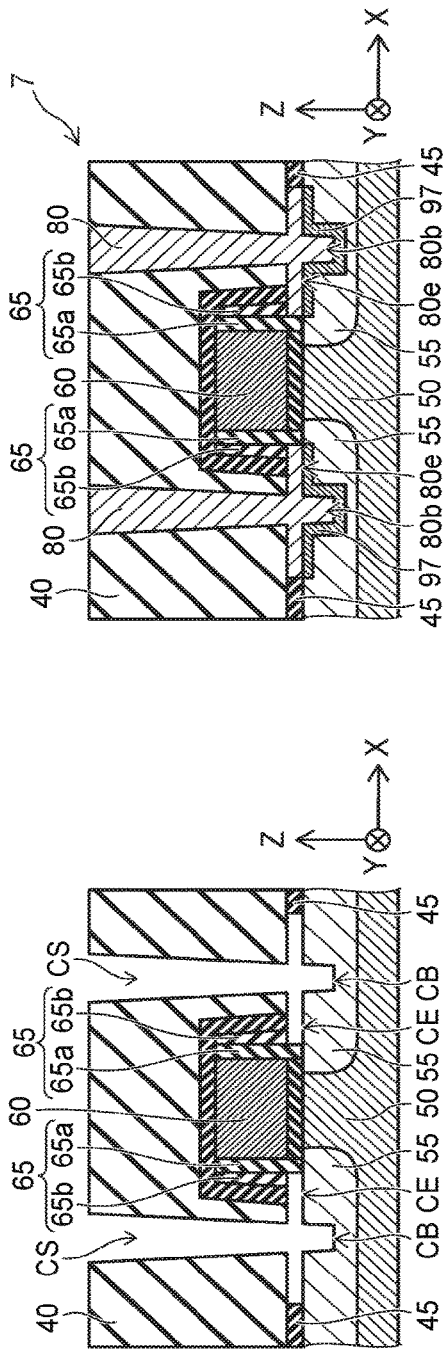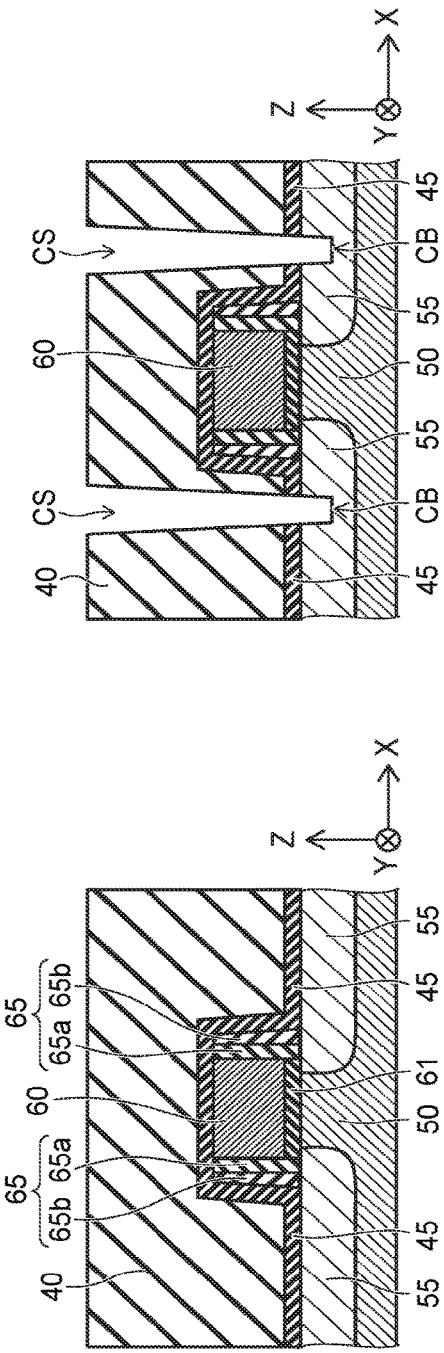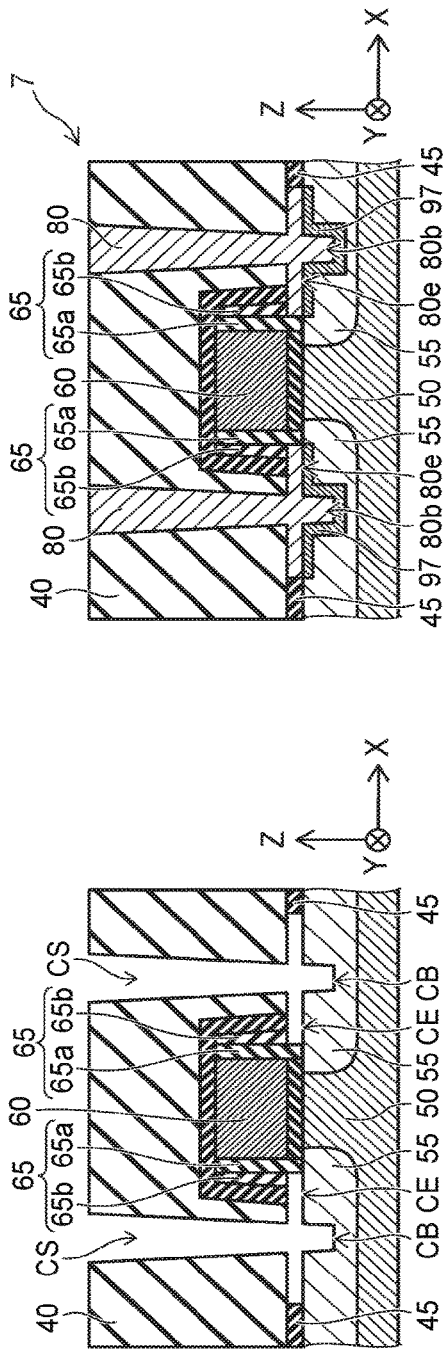

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/378,931 filed on Aug. 24, 2016; the entire contents of which are incorporated herein by reference.

FIELD

Embodiments are generally related to a semiconductor device and a method for manufacturing the same.

BACKGROUND

In a semiconductor device, it is preferable to form a silicide at an interface where a metal body contacts a semiconductor including silicon, in order to reduce a contact resistance therebetween. However, there may be a case where a defect such as a void or the like is generated by silicide agglomerating through a high temperature treatment performed after the silicide is formed. Therefore, the high temperature heat treatment is unable to be performed after the formation of silicide.

For example, in a semiconductor memory device, which includes 3-dimensionally disposed memory cells, a driving circuit is formed on the silicon substrate, and then, a memory cell array including a plurality of memory cells are formed. Since a manufacturing process of the memory cell array involves the high temperature heat treatment, the memory cell array would be unable to be formed, when silicides are formed in advance on gates and source drain regions of transistors that configure the drive circuit. As a result, silicides can be only formed in a contact forming process locally under a contact plug in the source drain regions of the transistors that configure the drive circuit, and there are drawbacks such as increase of parasitic resistance, and degradation of transistor performance.

BRIEF DESCRIPTION OF THE DRAWINGS

FIGS. 6A to 6D are schematic views showing a method for forming a contact structure according to a second variation of the first embodiment;

FIGS. 9A to 9D are schematic views showing a method for forming the contact structure according to the second embodiment;

FIGS. 11A to 11D are schematic views showing a method for forming the contact structure according to the variation of the second embodiment;

DETAILED DESCRIPTION

Figure 1:
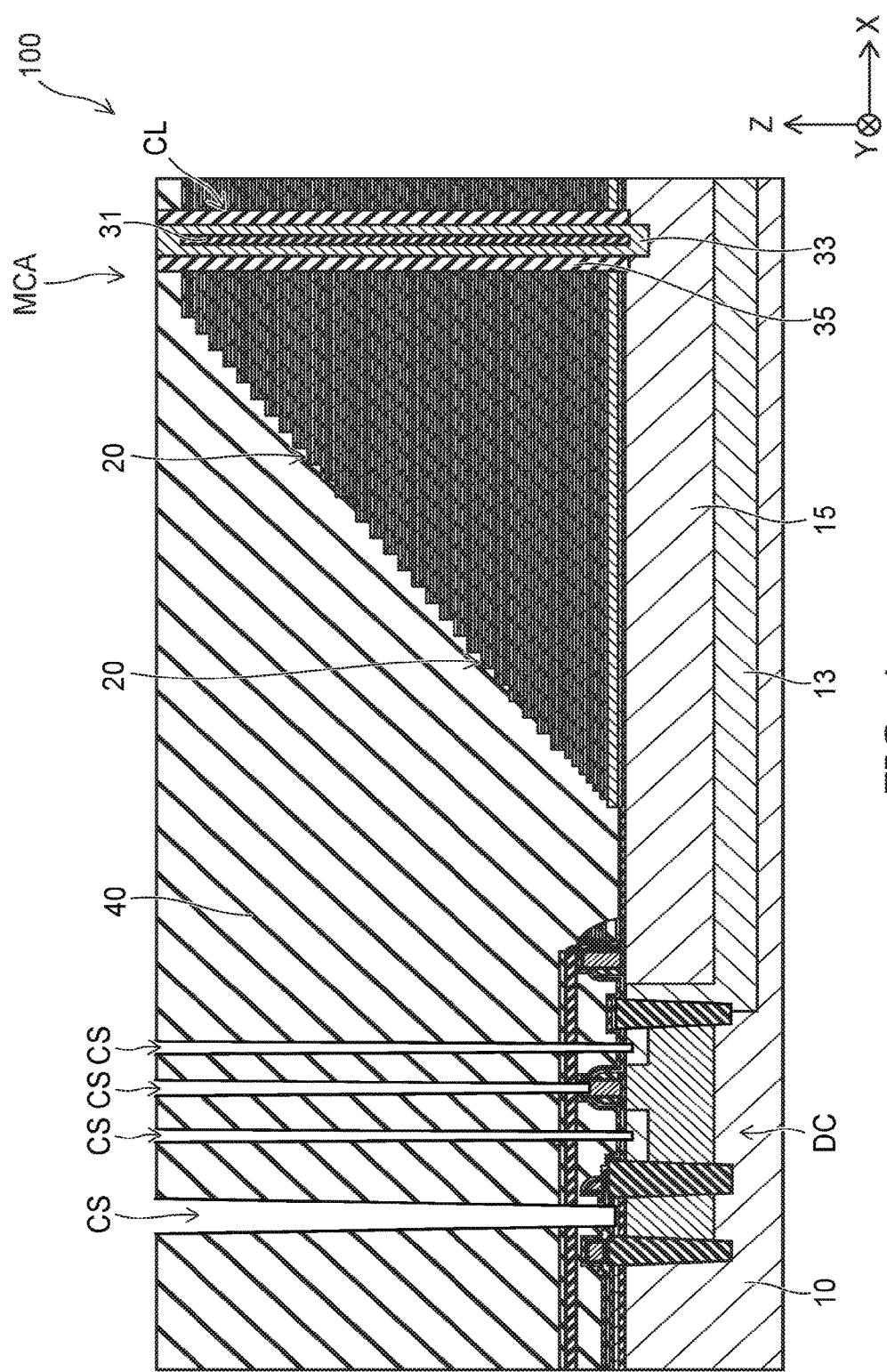
FIG. 1 is a schematic cross-sectional view showing a semiconductor device according to a first embodiment.

According to one embodiment, a semiconductor device comprises a channel body, a pair of source drain regions provided on the channel body and separated from each other, and a gate electrode provided above a part of the channel body between the pair of source drain regions. The semiconductor device further comprises a first insulating layer covering the pair of source drain regions and the gate electrode; a plurality of contact bodies extending in the first insulating layer in a first direction from each of the pair of source drain regions toward a top surface of the first insulating layer and electrically connected to the pair of source drain regions respectively; and a silicide layer provided between one of the pair of source drain regions and one of the plurality of contact bodies electrically connected to the one of the pair of source drain regions. The one of the plurality of contact bodies includes a main part extending in the first direction in the first insulating layer, and an expanded portion expanded in a second direction along a surface of the one of the pair of source drain regions; and the silicide layer is positioned between the expanded portion and the one of the pair of source drain regions.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic view showing a semiconductor device 100 according to an embodiment. The semiconductor device 100 is a NAND type semiconductor memory device and includes a memory cell array MCA having a plurality of memory cells disposed 3-dimensionally. FIG. 1 is a cross-sectional view showing a contact hole CS communicating with a drive circuit DC. The contact hole CS is formed after forming an insulating layer surrounding the memory cell array MCA.

As shown in FIG. 1, the semiconductor device 100 includes a substrate 10, and the memory cell array MCA provided thereon. The substrate 10 is, for example, a silicon substrate, and includes the drive circuit DC, an N-type well 13, and a P-type well 15. The drive circuit DC and the N-type well 13 are provided on a top surface of the substrate 10, and the P-type well 15 is provided in the N-type well 15.

The memory cell array MCA is provided on the P-type well 15, and includes a plurality of word lines 20 stacked in the Z-direction and a columnar portion CL. The columnar portion CL includes, for example, a core 31, a semiconductor layer 33, and an insulating layer 35. The core 31 is, for example, an insulator including silicon oxide, and extends through the word lines 20 in the Z-direction. The semiconductor layer 33 surrounds a lateral surface of the core 31 and extends in the Z-direction. The semiconductor layer 33 is electrically connected to the P-type well 15 at a bottom end thereof. The insulating layer 35 is positioned between the word lines 20 and the semiconductor layer 33, and is provided so as to surround a lateral surface of the semiconductor layer 33. The insulating layer 35 extends in the Z-direction along the semiconductor layer 33.

The memory cell array MCA includes memory cells MC provided at parts respectively where the columnar portion CL intersects with the word lines 20. The word lines 20 act as control gates of the memory cells MC, and the semiconductor layer 33 acts as a channel of the memory cell. The insulating layer 35 includes portions that act as charge storage portions of the memory cells MC between the word lines 20 and the semiconductor layer 33.

An insulating layer 40 is provided around the memory cell array MCA. The insulating layer 40 covers end portions of the word lines 20 formed into stairs at an end of the memory cell array MCA. The insulating layer 40 is formed to make a planarized surface over the memory cell array MCA and the substrate 10 by eliminating difference in level therebetween. That is, the insulating layer 40 has a top surface planarized to be positioned substantially at the same level as a top surface of the memory cell array MCA.

The contact holes CS are formed from such a top surface of the insulating layer 40 to be in communication with circuit elements in the drive circuit DC. For example, the contact holes CS extend through the thick insulating layer 40 which eliminates the difference in level between the memory cell array MCA and the substrate 10. A contact hole CS is formed to have a diameter smaller at the bottom surface of the insulating layer 40 than a diameter of an opening at the top surface of the insulating layer 40.

Figure 2A:
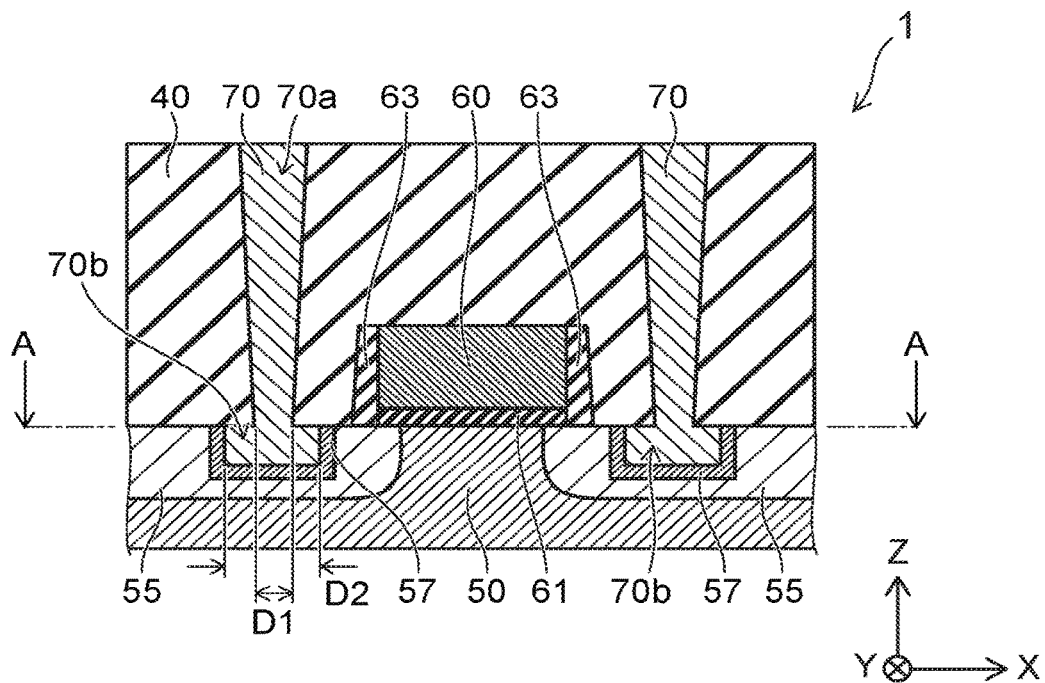
FIGS. 2A and 2B are schematic views showing a contact structure of the semiconductor device according to the first embodiment.
Figure 2B:
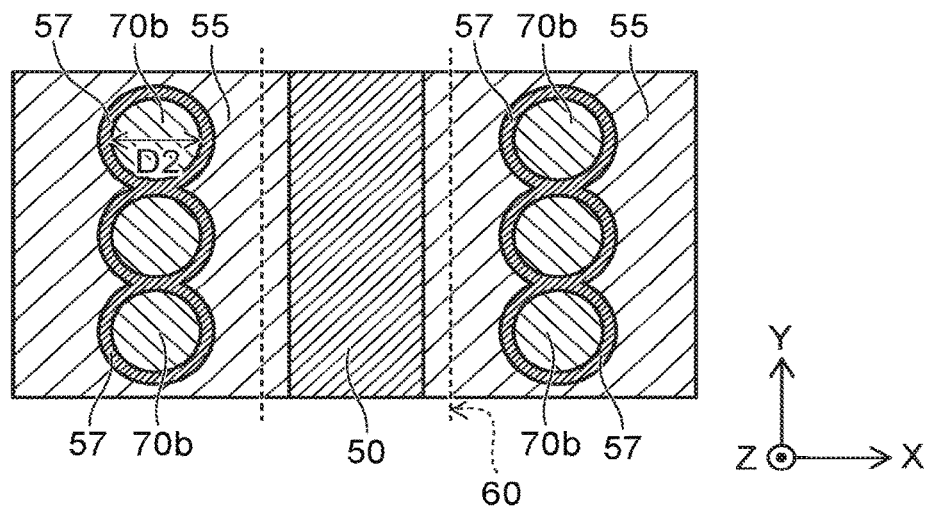

FIGS. 2A and 2B are schematic views showing one of transistors 1 that configure the drive circuit DC according to the first embodiment. FIG. 2A is a cross-sectional view showing a contact structure of the transistor 1. FIG. 2B is a schematic view showing a cross-section along A-A line shown in FIG. 2A.

As shown in FIG. 2A, the transistor 1 includes a channel body 50, a pair of source drain regions 55, and a gate electrode 60. The gate electrode 60 is provided above a part of the channel body 50 between the pair of source drain regions 55. A gate insulating film 61 is provided between the channel body 50 and the gate electrode 60, and a gate side wall 63 is provided on a lateral surface of the gate electrode 60. A contact plug 70 is electrically connected to each of the source drain regions 55

The contact plug 70 is provided, for example, with a columnar shape extending in the Z-direction in the insulating layer 40. The contact plug 70 includes a main portion 70a extending in the insulating layer 40 and an expanded portion 70b. The expanded portion 70b is provided to be embedded in each of the source drain regions 55. The main portion 70a has a diameter $D_1$ at the bottom end, and the expanded portion 70b has a diameter $D_2$ in the cross-section parallel to the X-Y plane (see FIG. 2B). The diameter $D_2$ is larger than the diameter $D_1$.

The transistor 1 further includes a silicide layer 57 provided between the source drain region 55 and the expanded portion 70b. Thereby, it is possible to make the contact resistance small between the source drain region 55 and the contact plug 70.

As shown in FIG. 2B, a plurality of contact plugs 70 are provided, for example, on each of the source drain regions 55. As shown by broken lines in FIG. 2B, the gate electrode 60 extends in the Y-direction, and the contact plugs 70 are disposed along the gate electrode 60. The expanded portions 70b are provided, for example, separately from each other in the Y-direction. Then, as shown in FIG. 2B, silicide layers 57 may be formed together and connected to each other.

Although there would be a method of providing a bar-like contact plug extending in both of the Z-direction and the Y-direction, it is preferable to dispose a plurality of columnar like contact plugs 70 along the gate electrode 60 to reduce parasitic capacitance between the contact plugs 70 and the gate electrode 60.

Figure 3A:
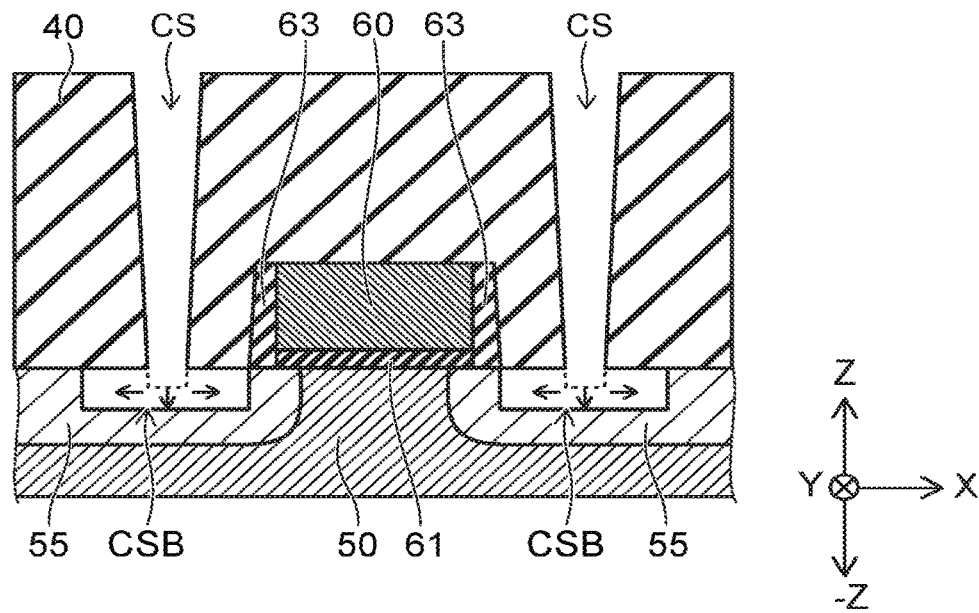
FIGS. 3A and 3B are schematic views showing a method for forming the contact structure according to the first embodiment.
Figure 3B:
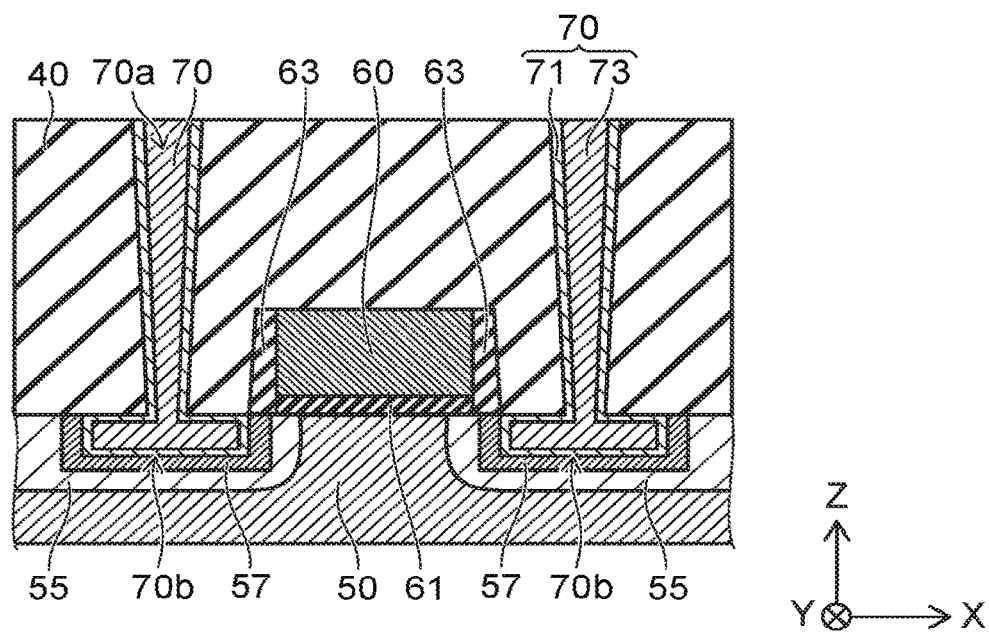

Hereinafter, a method for forming the contact structure according to the first embodiment will be described with reference to FIGS. 3A and 3B. FIGS. 3A and 3B are cross-sectional views of the transistor 1 and show a process of contact formation on the source drain regions 55.

As shown in FIG. 3A, cavities CSB are formed inside the source drain regions 55 respectively by expanding the bottom ends of the contact holes CS. The contact hole CS is formed to extend through the insulating layer 40 in the Z-direction, for example, using anisotropic RIE (Reactive Ion Etching). Then, the contact holes CS are formed to have the bottom ends positioned inside the source drain regions 55 by etching a part of the substrate 10 (see FIG. 1). Subsequently, the substrate 10 is selectively etched using isotropic dry etching, and the bottom ends of the contact holes CS are expanded in the X-direction, the Y-direction and the −Z-direction.

As shown in FIG. 3B, the contact plugs 70 are formed in the contact holes CS and the cavities CSB. Thereby, the contact plugs 70 are provided respectively with a shape having a main portion 70a and an expanded portion 70b.

The contact plugs 70 each include, for example, a barrier metal 71 and a core metal 73. The barrier metal 71 is formed to cover an inner surface of the contact hole CS and the cavity CSB. The core metal 73 is embedded in the contact hole CS and the cavity CSB. The barrier metal 71 and the core metal 73 are formed, for example, using CVD (Chemical Vapor Deposition). The barrier metal 71 has a structure, for example, in which a titanium layer and a titanium nitride layer are stacked. The titanium layer is formed to contact the source drain region 55. The core metal 73 includes, for example, tungsten (W).

Subsequently, the source drain regions 55 and the contact plugs 70 are subjected to a heat treatment, and thereby, the silicide layers 57 are formed at the interface thereof. Specifically, a wafer in which the transistor 1 is to be formed, for example, is placed inside a heat treatment furnace, and is subjected to the treatment at a prescribed temperature and for a prescribed time. The silicide layer 57 includes, for example, titanium silicide.

Figure 4A:
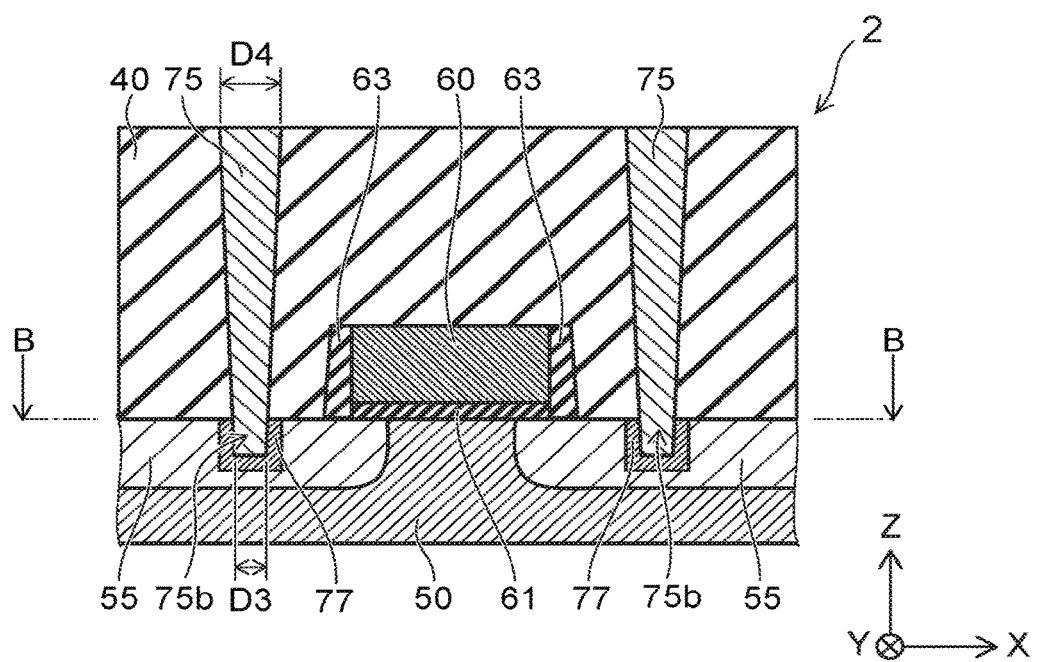
FIGS. 4A and 4B are schematic views showing a contact structure of a semiconductor device according to a comparative example.
Figure 4B:
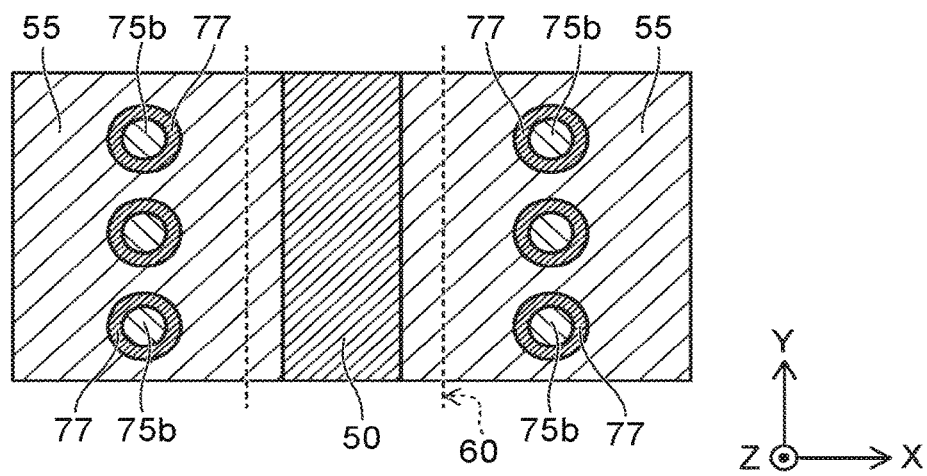

FIGS. 4A and 4B are schematic views showing a transistor 2 according to a comparative example. FIG. 4A is a schematic cross-sectional view showing a contact structure of the transistor 2. FIG. 4B is a schematic view showing a cross section taken along B-B line shown in FIG. 4A.

As shown in FIG. 4A, a transistor 2 includes contact plugs electrically connected to the source drain regions 55 respectively. The contact plugs 75 are provided respectively in a columnar shape extending in the Z-direction in the insulating layer 40, and the bottom end portions 75b thereof are positioned inside the source drain regions 55 respectively. The transistor 2 further includes silicide layers 77 each provided between a source drain region 55 and a bottom end portion 75b.

As shown in FIG. 4B, a plurality of contact plugs 75 are provided on each of the source drain regions 55. As shown by broken lines in FIG. 4B, the gate electrode 60 extends in the Y-direction, and the contact plugs 75 are disposed along the gate electrode 60. The bottom end portions 75b are, for example, provided separately from each other in the Y-direction. The silicide layers 77 are also formed apart from each other in the Y-direction.

In this example, a diameter $D_3$ of a bottom end of the contact plug 75 is smaller than a diameter $D_4$ of a top end exposed to a top surface of the insulating layer 40. Therefore, a silicide layer 77 contacting a source drain region 55 is formed to have a small area around the bottom end portion 75b, and a contact resistance is increased between the source drain region 55 and the contact plug 75. Although the bottom end portion 75b can be formed to be deeper in order to increase the contact area between the source drain region 55 and the silicide layer 77, a junction leak current may increase between the channel body 50 and the source drain region 55, when the bottom end portion 75b locates at a position close to a boundary between the channel body 50 and the source drain region 55.

In contrast, it is possible in the transistor 1 shown in FIG. 2 to enlarge the area of the silicide layer 57 contacting the source drain region 55 by providing the expanded portion 70b expanded in a lateral direction. Thereby, the contact resistance can be reduced between the source drain region 55 and the contact plug 70. That is, the contact area between the source drain region 55 and the silicide layer 57 is widened in the embodiment by expanding the bottom end portion of the contact plug 70 not only in a depth direction (−Z-direction), but also in the lateral direction (X-direction and Y-direction), and thus, the contact resistance can be reduced. That is, the contact resistance between the source drain region 55 and the contact plug 70 can be reduced without increasing the junction leak current between the channel body 50 and the source drain region 55.

An advantage of reducing the parasitic resistance of the source drain region 55 can be obtained by making the contact plug 70 close to the gate electrode 60. Furthermore, since other portion of the contact plug 70 is not expanded except for the bottom end portion, the increase of parasitic capacitances between the contact plugs 70, and between the contact plug 70 and the gate electrode 60 is suppressed.

Figure 5A:
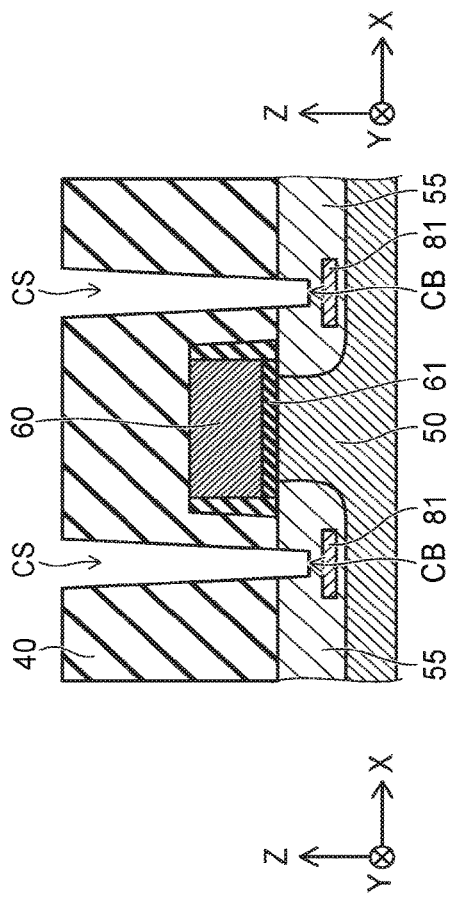
FIGS. 5A to 5C are schematic views showing a method for forming a contact structure according to a first variation of the first embodiment.
Figure 5B:
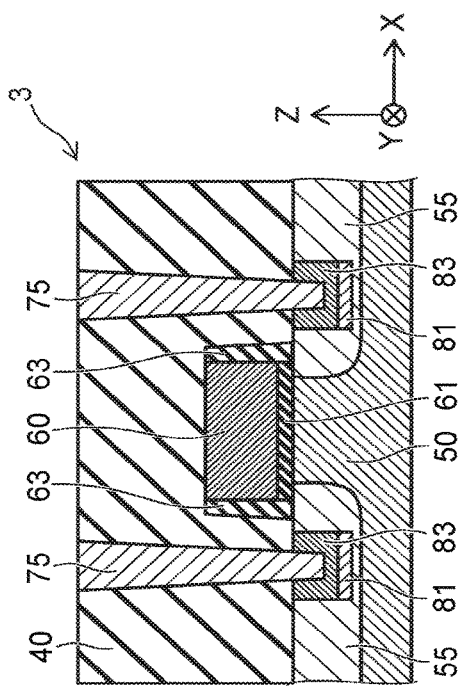
Figure 5C:
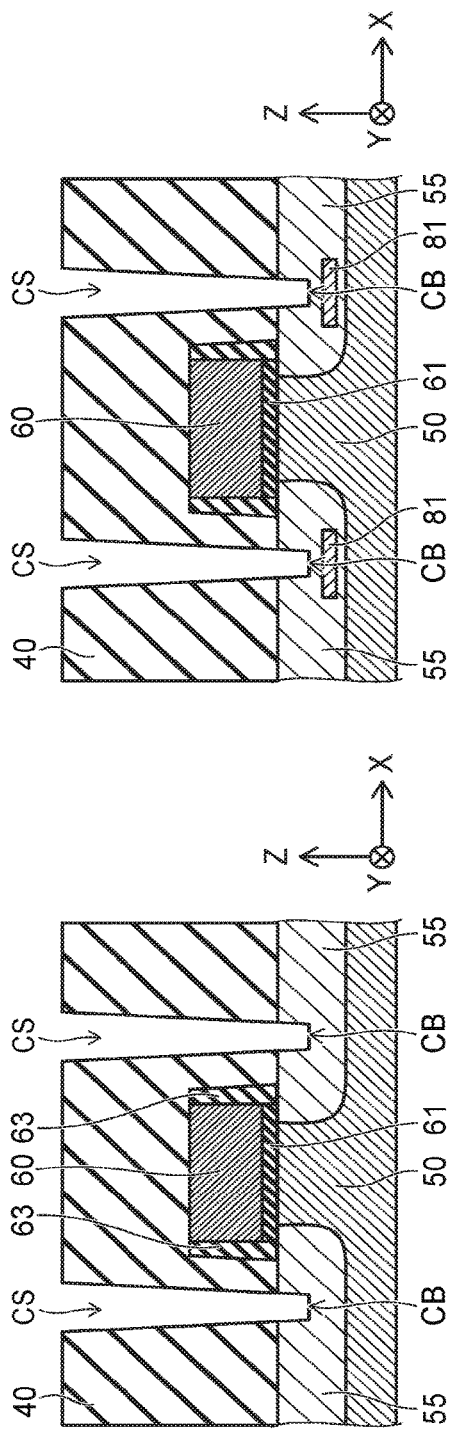

FIGS. 5A to 5C are schematic cross-sectional views showing a method for forming a contact structure of a transistor 3 according to a first variation of the first embodiment. FIGS. 5A to 5C are cross-sectional views of the transistor 3, and show the process of forming contacts to the source drain regions 55.

As shown in FIG. 5A, the contact hole CS is formed from the top surface of the insulating layer 40 with a depth capable of reaching in the source drain region 55. The contact hole CS is formed so that the bottom end CB is positioned at a level under a surface of the source drain region 55.

As shown in FIG. 5B, a blocking layer 81 is formed between a boundary of the channel body 50 and the source drain region 55 and the bottom end CB of the contact hole CS. The blocking layer 81 is formed by ion-implanting a nitrogen atom or a fluorine atom through the contact hole CS. That is, the blocking layer 81 includes an element suppressing silicidation reaction in the source drain region 55. The blocking layer 81 is formed to have conductivity.

As shown in FIG. 5C, the contact plug 75 is formed in the contact hole CS. The contact plug 75 includes, for example, the barrier metal 71 and the core metal 73. The barrier metal 71 has a stacked structure of a titanium layer and a titanium nitride layer, for example. The core metal 73 includes, for example, tungsten (W). Subsequently, a silicide layer 83 is formed by thermally treating the source drain region 55 and the contact plug 75.

As shown in FIG. 5C, the blocking layer 81 suppresses the silicide layer 83 from spreading downward (−Z-direction). As a result, the silicide layer 83 is formed in an area between the contact plug 75 and the blocking layer 81 under the contact plug 75, and further extends in the X-direction and the Y-direction from an area beside a lateral surface of the contact plug 75 positioned at a level under the surface of the source drain region 55. Thereby, the area of the source drain region 55 or the conductive blocking layer 81 in the source drain region 55, which contacts the silicide layer 83, is increased; and the contact resistance between the source drain region 55 and the contact plug 75 can be reduced while suppressing the junction leak current that would increase as the silicide layer 83 is positioned closer to the boundary between the channel body 50 and the source drain region 55.

FIGS. 6A to 6D are schematic cross-sectional views showing a method for forming a contact structure of a transistor 4 according to a second variation of the first embodiment. FIGS. 6A to 6D are cross-sectional views of the transistor 4, and show a process of forming contacts to the source drain regions 55.

As shown in FIG. 6A, a part of the source drain region 55 is removed using the gate electrode 60 and the gate side wall 63 as an etching mask after the gate electrode 60 and the gate side wall 63 are formed above the channel body 50. The source drain region 55 is etched, for example, using RIE.

Subsequently, a blocking layer 87 is formed, for example, by ion-implanting a nitrogen atom or a fluorine atom through a surface of the source drain region 55. The block layer 87 is formed also through a lateral surface of a part of the source drain region 55 positioned below the gate side wall 63, for example, by performing the oblique ion implantation with a large incident angle. The blocking layer 87 is formed to have conductivity.

As shown in FIG. 6B, a semiconductor layer 89 is formed in a space formed by removing the part of the source drain region 55. The semiconductor layer 89 is formed selectively, for example, using epitaxial growth. The semiconductor layer 89 has the same conductivity type as that of the source drain region 55, and includes, for example, a material same as that of the source drain region 55. The semiconductor layer 89 is, for example, a silicon layer.

As shown in FIG. 6C, the insulating layer 40 is formed to cover the gate electrode 60 and the semiconductor layer 89. Then, the contact hole CS is formed from the top surface of the insulating layer 40 to have a depth capable of reaching the semiconductor layer 89. Subsequently, the semiconductor layer 89 is selectively etched through the contact hole CS, and the cavity CSB is formed, where the bottom end of the contact hole CS is expanded in a lateral direction (X-direction and Y-direction). The semiconductor layer 89 is etched, for example, using isotropic dry etching.

As shown in FIG. 6D, the contact plug 70 is formed in the contact hole CS and the cavity CSB. Then, the contact plug 70 and the semiconductor layer 89 are subjected to a heat treatment, and the silicide layer 57 is formed.

Also in this example, it is possible to reduce a contact resistance between the source drain region 55 and the contact plug 70, since the silicide layer 57 is widened by the expanded portion 70b of the contact plug 70 formed in the cavity CSB. The blocking layer 87 put a limit to the spreading of the silicide layer 57. Thereby, it is possible to suppress the junction leak current that would increase as the silicide layer 57 is positioned closer to the interface between the channel body 50 and the source drain region 55.

The blocking layer 87 can be formed by increasing energy of ion implantation. That is, an element suppressing silicidation reaction may be implanted at a prescribed depth without removing a part of the soured drain region 55.

FIGS. 7A to 7D are schematic cross-sectional views showing a method for forming a contact structure of a transistor 5 according to a third variation of the first embodiment. FIGS. 7A to 7D are cross-sectional view of the transistor 5, and show a process of forming contacts to the source drain regions 55.

Figure 7A:
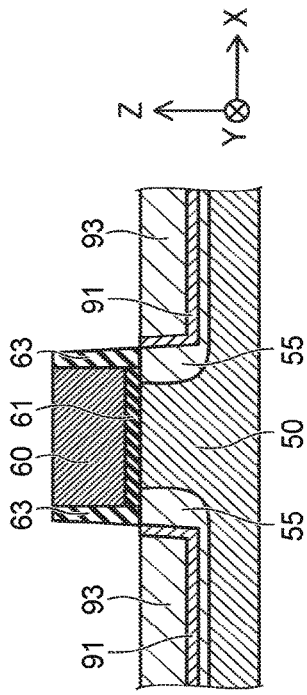
FIGS. 7A to 7D are schematic views showing a method for forming a contact structure according to a third variation of the first embodiment.

As shown in FIG. 7A, a part of the source drain region 55 is removed using the gate electrode 60 and the gate side wall 63 as an etching mask after the gate electrode 60 and the gate side wall 63 are formed above the channel body 50. The source drain region 55 is etched, for example, using RIE.

Figure 7B:
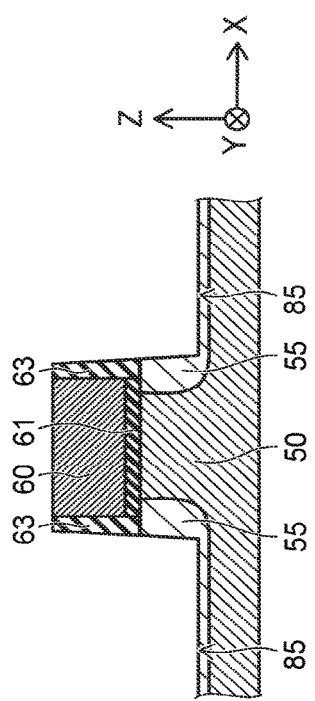

As shown in FIG. 7B, a blocking layer 91 and a semiconductor layer 93 are formed in order in a space which is formed by removing a part of the source drain region 55. The blocking layer 91 and the semiconductor layer 93 are formed selectively, for example, using epitaxial growth. The blocking layer 91 is a semiconductor layer having the same conductivity type as the source drain region 55, and includes an element suppressing the silicidation reaction. The blocking layer 91 is, for example, a silicon germanium layer. The blocking layer 91 has, for example, a thickness of 5 to 10 nanometers, and a content ratio of germanium is 20 to 50 atomic percent. The semiconductor layer 93 has the same conductivity type as the source drain region 55, and includes, for example, the same material as the source drain region 55. The semiconductor layer 93 is, for example, a silicon layer.

Figure 7C:
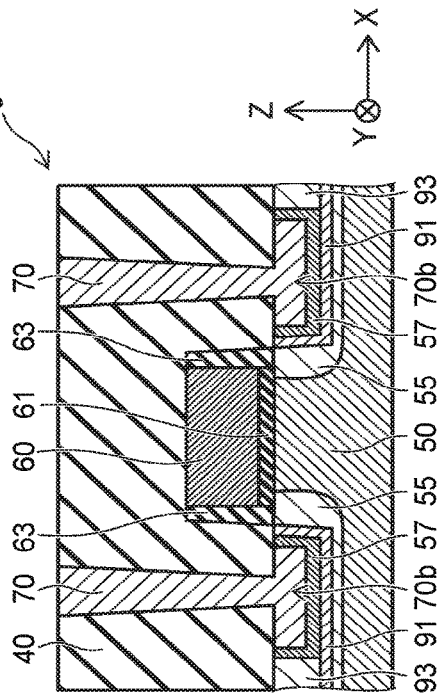

As shown in FIG. 7C, the insulating layer 40 is formed to cover the gate electrode 60 and the semiconductor layer 93. Then, the contact hole CS is formed from the top surface of the insulating layer 40 with a depth capable of reaching the semiconductor layer 93. The cavity CSB is further formed where the bottom end at the contact hole CS is expanded in a lateral direction (X-direction and Y-direction).

Figure 7D:
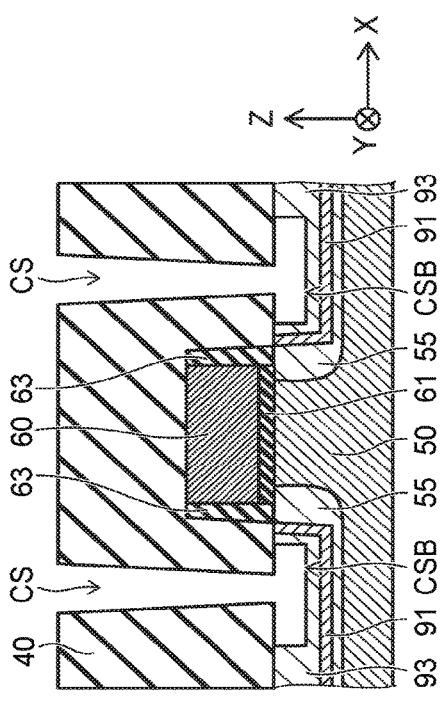

As shown in FIG. 7D, the contact plug 70 is formed in the contact hole CS and the cavity CSB. Subsequently, the contact plug 70 and the semiconductor layer 93 are subjected to a heat treatment, and the silicide layer 57 is formed. Also in this example, a contact resistance between the source drain region 55 and the contact plug 70 is reduced, since the silicide layer 57 is widened by the expanded portion 70b of the contact plug 70 formed in the cavity CSB. The blocking layer 91 puts a limit to the expanding of the silicide layer 57, and suppresses the junction leak current at the interface between the channel body 50 and the source drain region 55 from increasing.

Second Embodiment

Figure 8A:
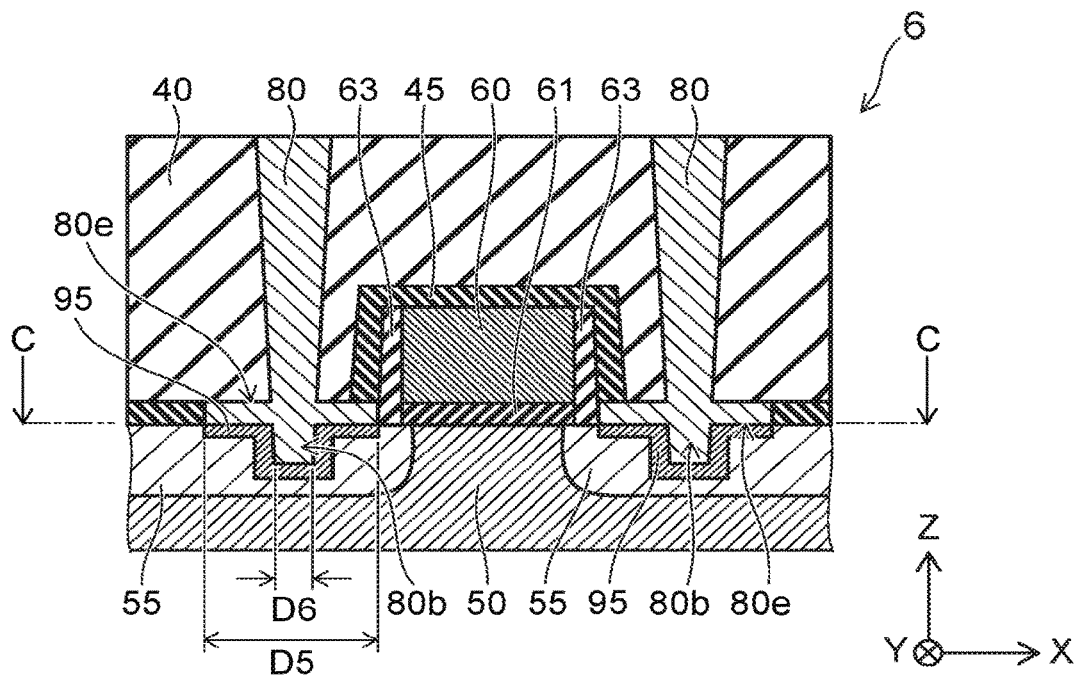
FIGS. 8A and 8B are schematic views showing a contact structure of a semiconductor device according to the second embodiment.
Figure 8B:
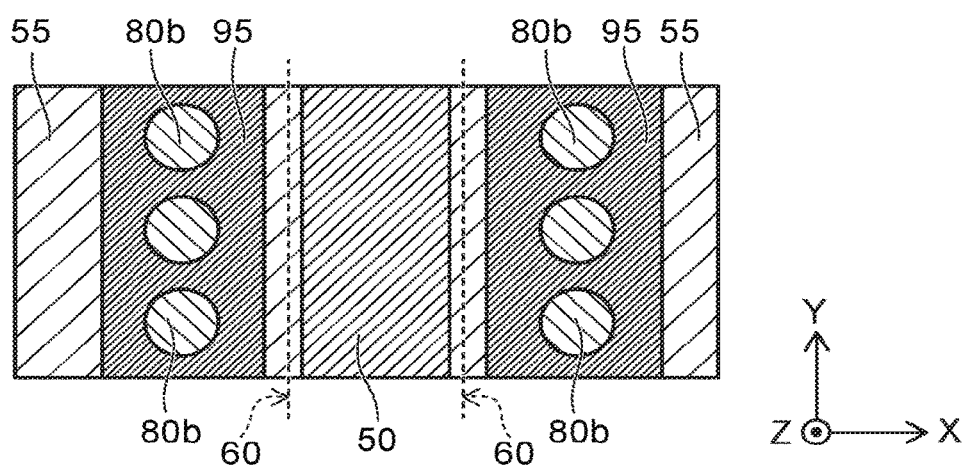

FIGS. 8A and 8B are schematic views showing a transistor 6 according to a second embodiment. FIG. 8A is a schematic cross-sectional view showing a contact structure of the transistor 6. FIG. 8B is a schematic view showing a cross-section along C-C line shown in FIG. 8A.

As shown in FIG. 8A, the transistor 6 includes the gate electrode 60 provided above the channel body 50 and a pair of the source drain regions 55 provided on both sides of the gate electrode 60. The gate side wall 63 is provided on a lateral surface of the gate electrode 60 on both sides thereof. The insulating layer 40 covers the source drain regions 55, the gate electrode 60 and the gate side walls 63. Furthermore, an insulating layer 45 is provided between the insulating layer 40 and the source drain regions 55, between the insulating layer 40 and the gate side wall 63 and between the insulating layer 40 and the gate electrode 60.

The transistor 6 includes a contact plug 80 electrically connected to the source drain region 55. The contact plug 80 is provided with a columnar shape extending in the Z-direction in the insulating layer 40. For example, a bottom end portion 80b of the contact plug 80 is provided to be embedded in the source drain region 55.

The contact plug 80 further includes an expanded portion 80e spreading in a lateral direction (X-direction, Y-direction) along the surface of the source drain region 55. A width $D_5$ of the expanded portion 80e in the lateral direction is wider than a width $D_6$ of the bottom end portion 80b in the lateral direction. The transistor 6 further includes a silicide layer 95 provided between the source drain region 55 and the bottom end portion 80b and between the source drain region 55 and the expanded portion 80e.

As shown in FIG. 8B, a plurality of contact plugs 80 are provided on each of the source drain regions 55. As shown by broken lines in FIG. 8B, the gate electrode 60 extends in the Y-direction, and the contact plugs 80 are disposed along the gate electrode 60. The bottom end portions 80b of the plurality of contact plugs 80 are, for example, disposed separately from each other in the Y-direction. The silicide layers 95 are each provided between the source drain region 55 and the expanded portion 80e. The silicide layers 95 are joined together and extend in the Y-direction.

In the embodiment, an area of the silicide layer 95 contacting the source drain region 55 is increased by providing the expanded portion 80e. Thereby, the contact resistance is reduced between the source drain region 55 and the contact plug 80. The embodiment may include a structure without the bottom end portion 80b under the expanded portion 80e. That is, the structure may be included, where the bottom end of the contact plug 80 is expanded in the lateral direction along the surface of the source drain region 55.

Hereinafter, a method for forming the contact structure according to the second embodiment will be described with reference to FIGS. 9A to 9D. FIGS. 9A to 9D are schematic cross-sectional views showing the transistor 6, and show a process of forming contacts to the source drain regions 55.

As shown in FIG. 9A, the insulating layer 40 and the insulating layer 45 are formed to cover the source drain region 55 and the gate electrode 60. The insulating layer 40 is, for example, a silicon oxide layer. The insulating layer 45 is, for example, a silicon nitride layer formed using CVD, and is formed between the insulating layer 40 and the source drain region 55 and between the insulating layer 40 and the gate electrode 60.

As shown in FIG. 9B, the contact hole CS is formed from the top surface of the insulating layer 40 with a depth capable of reaching the source drain region 55. The contact hole CS is formed, for example, using anisotropic RIE. The bottom end CB of the contact hole CS is positioned in the source drain region 55. For example, it may be possible to form the contact hole CS by using the insulating layer 45 as an etching stopper such that the bottom end CB of the contact hole CS is not positioned in the source drain region 55.

As shown in FIG. 9C, a part of the insulating layer 45 is selectively removed, and an expanded portion CE is formed in the contact hole CS. The expanded portion CE is formed, for example, by selectively removing the insulating layer 45 using wet etching. The expanded portion CE extends in the lateral direction (X-direction, Y-direction) along the surface of the source drain region 55. An end of the expanded portion CE on the gate electrode 60 side locates at a position where making the lateral surface of the gate side wall 63 exposed. The gate side wall 63 is, for example, a silicon oxide layer, and acts as an etching stopper. Thereby, the end of the expanded portion CE on the gate electrode 60 side is located in a self-aligned manner at a position where the lateral surface of the gate side wall 63 is located.

As shown in FIG. 9D, the contact plug 80 is formed in the contact hole CS. The contact plug 80 includes, for example, the barrier metal 71 and the core metal 73 (see FIG. 3B). The contact plug 80 is formed to include the expanded portion 80e extending along the surface of the source drain region 55 and the bottom end portion 80b positioned at a level under the expanded portion 80e.

For example, when the insulating layer 45 is thin, the expanded portion CE of the contact hole CS is filled with the barrier metal 71 in the process of forming the contact plug 80. In such a case, the expanded portion 80e is a part of the barrier metal 71.

Subsequently, the source drain region 55 and the contact plug 80 are subjected to a heat treatment, and the silicide layer 95 is formed. Also in this example, a contact resistance between the source drain region 55 and the contact plug 80 is reduced, since a part of the silicide layer 95 formed between the source drain region 55 and the expanded portion 80e is widened.

Ends of the expanded portion 80e and the silicide layer 95 on the gate electrode 60 side are located in the self-aligned manner at the position of the lateral surface of the gate side wall 63. Thus, variations of a distance between the gate electrode 60 and the expanded portion 80e are suppressed, and the parasitic resistance of the source drain region 55 and variations of the parasitic resistance can be reduced.

Figure 10A:
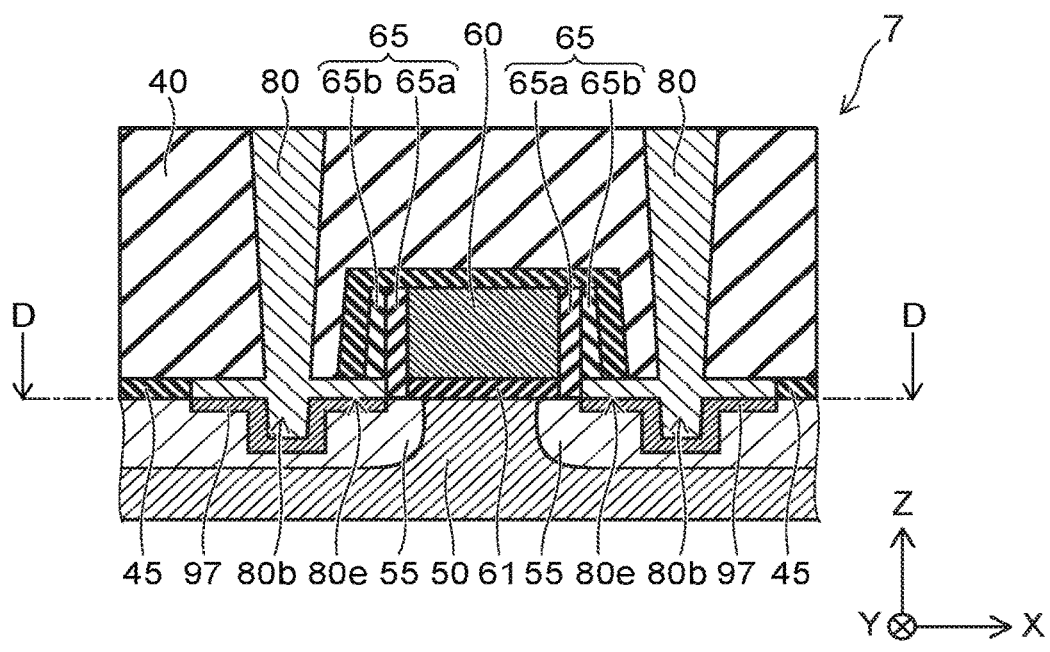
FIGS. 10A and 10B are schematic views showing a contact structure of a semiconductor device according to a variation of the second embodiment.
Figure 10B:
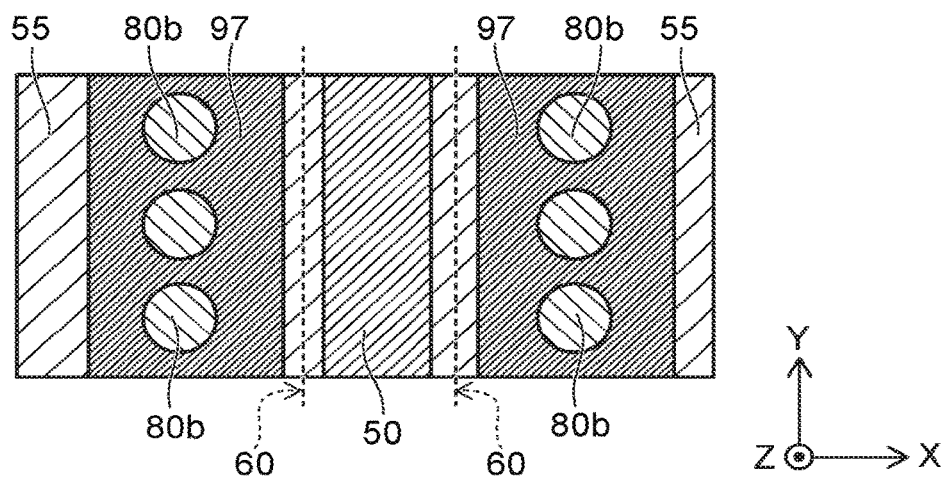

FIGS. 10A and 10B are schematic views showing a transistor 7 according to a variation of the second embodiment. FIG. 10A is a schematic cross-sectional view showing a contact structure of the transistor 7. FIG. 10B is a schematic view showing a cross-section along D-D line shown in FIG. 10A.

As shown in FIG. 10A, the transistor 7 includes gate side walls 65 provided on both sides of the gate electrode 60. A gate side wall 65 includes a first side wall 65a and a second side wall 65b. The first side wall 65a is positioned between the gate electrode 60 and the second side wall 65b. The first side wall 65a is, for example, a silicon oxide layer, and the second side wall 65b is, for example, a silicon nitride layer.

The transistor 7 includes the contact plug 80 electrically connected to each of the source drain regions 55, and includes a silicide layer 97 provided between the source drain region 55 and the contact plug 80. The contact plug 80 includes the expanded portion 80e, and the end thereof on the gate electrode 60 side is located at the position where contacting a lateral surface of the first side wall 65a. The end of the silicide layer 97 on the gate electrode 60 side is also located at the position close to the lateral surface of the first side wall 65a.

When a thickness in the X-direction of the gate side wall 65 is the same as a thickness in the X-direction of the gate side wall 63, for example, a distance between the ends of the expanded portion 80e and the silicide layer 97 on the gate electrode 60 side and the gate electrode 60 is short by the thickness in the X-direction of the second side wall 65b. Thereby, it is possible to reduce the contact resistance between the source drain region 55 and the contact plug 80.

As shown in FIG. 10B, a plurality of contact plugs 80 are provided on each of the source drain regions 55. The contact plugs 80 are disposed along the gate electrode 60. The bottom end portions 80b of the plurality of contact plugs 80 are, for example, provided separately from each other in the Y-direction. The silicide layers 97 are joined together, and extend in the Y-direction between the source drain region 55 and the expanded portions 80e.

FIGS. 11A to 11D are schematic cross-sectional views showing a method for forming a contact structure according to the variation of the second embodiment. Then, the method for forming the contact structure according to the variation of the second embodiment will be described with reference to FIGS. 11A to 11D. FIGS. 11A to 11D are schematic cross-sectional views showing the transistor 7, and show a process of forming contacts to the source drain regions 55.

As shown in FIG. 11A, the insulating layer 40 and the insulating layer 45 are formed to cover the source drain region 55 and the gate electrode 60 after the gate side wall 65 is formed on the side surface of the gate electrode 60. The gate side wall 65 has a stacked structure including the first side wall 65a and the second side wall 65b. The insulating layer 40 and the first side wall 65a are, for example, a silicon oxide layer, and the insulating layer 45 and the second side wall 65b are, for example, a silicon nitride layer. The first side wall 65a and the second side wall 65b are formed, for example, using CVD.

As shown in FIG. 11B, the contact hole CS is formed from the top surface of the insulating layer 40 with a depth capable of reaching the source drain region 55. The contact hole CS is formed, for example, using anisotropic RIE, and the bottom end CB is positioned in the source drain region 55.

As shown in FIG. 11C, a part of the insulating layer 45 is selectively removed, and the expanded portion CE is formed in the contact hole CS. The expanded portion CE is formed, for example, by selectively removing the insulating layer 45 using wet etching. The expanded portion CE extends in the lateral direction (X-direction, Y-direction) along the surface of the source drain region 55. Then, a part of the second side wall 65b is etched as well, and an end of the expanded portion CE on the gate electrode 60 side extends to a position where making the lateral surface of the first side wall 65a exposed. The first side wall 65a acts as an etching stopper. Thereby, the end of the expanded portion CE is formed in the self-aligned manner on the gate electrode 60 side.

As shown in FIG. 11D, the contact plug 80 is formed in the contact hole CS. The contact plug 80 includes the expanded portion 80e extending along the surface of the source drain region 55 and the bottom end portion 80b positioned at a level under the expanded portion 80e.

Subsequently, the source drain region 55 and the contact plug 80 are subjected to a heat treatment, and the silicide layer 97 is formed. Also in this example, it is possible to reduce a contact resistance between the source drain region 55 and the contact plug 80, since the portion formed between the source drain region 55 and the expanded portion 80e widens the silicide layer 97.

The ends of the expanded portion 80e and the silicide layer 97 on the gate electrode 60 side is formed in the self-aligned manner at a position of the lateral surface of the first side wall 65a. Therefore, it is possible to suppress variations of the distance between the gate electrode 60 and the expanded portion 80e, and to reduce the parasitic resistance of the source drain region 55 and variations of the parasitic resistance.

Third Embodiment

Figure 12A:
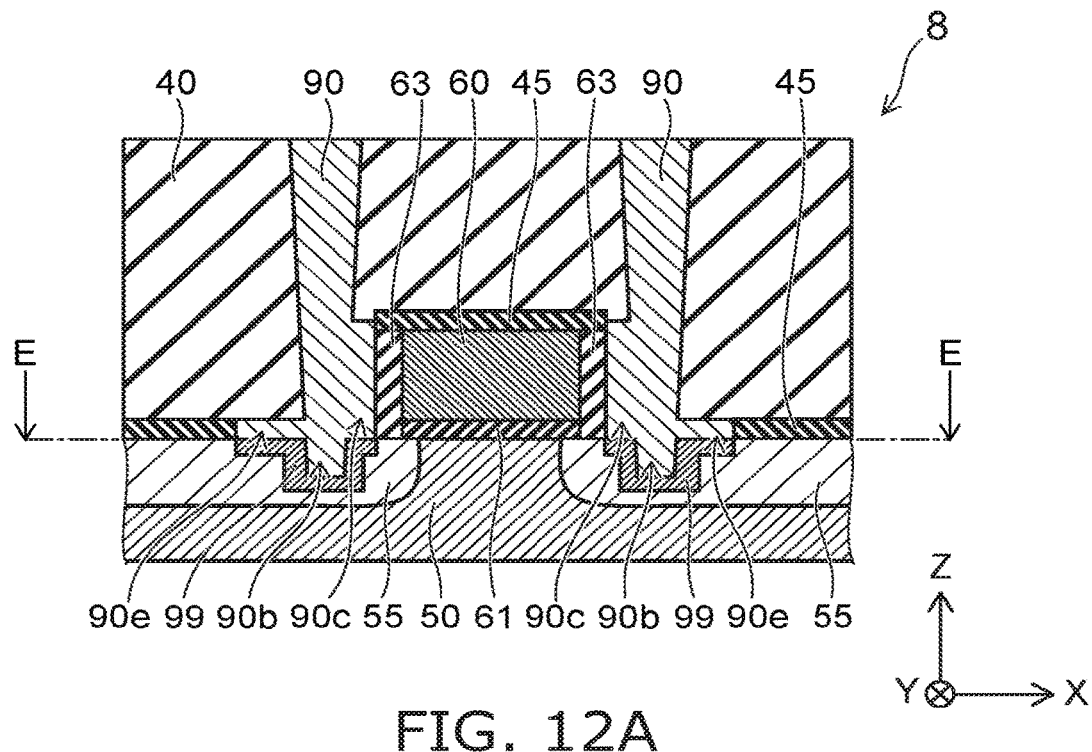
FIGS. 12A and 12B are schematic views showing a contact structure of a semiconductor device according to a third embodiment.
Figure 12B:
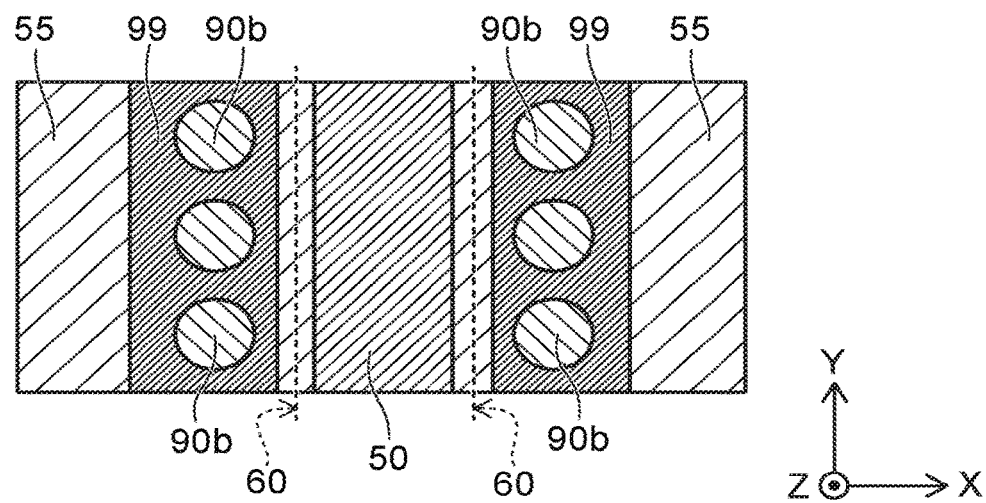

FIGS. 12A and 12B are schematic views showing a transistor 8 according to a third embodiment. FIG. 12A is a schematic cross-sectional view showing a contact structure of the transistor 8. FIG. 12B is a schematic view showing a cross-section along E-E line shown in FIG. 12A.

As shown in FIG. 12A, the transistor 8 includes the gate electrode 60 provided above the channel body 50, and the source drain regions 55 provided on both sides of the gate electrode 60. The gate side wall 63 is provided on the lateral surface of the gate electrode 60. The insulating layer 40 covers the source drain regions 55 and the gate electrode 60. Furthermore, the insulating layer 45 is provided between the insulating layer 40 and the source drain region 55 and between the insulating layer 40 and the gate electrode 60.

The transistor 8 includes a contact plug 90 electrically connected to each of the source drain regions 55. The contact plug 90 is provided with a columnar shape extending in the Z-direction in the insulating layer 40, and the bottom end portion 90b thereof is provided to be embedded in the source drain region 55. The contact plug 90 further includes a side wall portion 90c and an expanded portion 90e. The side wall portion 90c contacts the gate side wall 63. The expanded portion 90e spreads in the lateral direction (X-direction, Y-direction) along the surface of the source drain region 55. The transistor 8 further includes a silicide layer 99 provided between the source drain region 55 and the bottom end portion 90b, between the source drain region 55 and the side wall portion 90c, and between the source drain region 55 and the expanded portion 90e.

As shown in FIG. 12B, a plurality of contact plugs 90 are provided on each of the source drain regions 55. As shown by broken lines in FIG. 12B, the gate electrode 60 extends in the Y-direction, and the contact plugs 90 are disposed along the gate electrode 60. The bottom end portions 90b of the plurality of contact plugs 90 are, for example, provided separately from each other in the Y-direction. The silicide layers 99 are joined together and extend in the Y-direction between the source drain region 55 and the expanded portions 90e.

In the embodiment, an area of the silicide layer 99 contacting the source drain region 55 is widened by providing the expanded portion 90e. Thereby, it is possible to reduce a contact resistance between the source drain region 55 and the contact plug 90.

Hereinafter, a method for forming the contact structure according to the third embodiment will be described with reference to FIGS. 13A to 13D. FIGS. 13A to 13D are schematic cross-sectional views showing the transistor 8, and show a process of forming contacts to the source drain region 55.

Figure 13A:
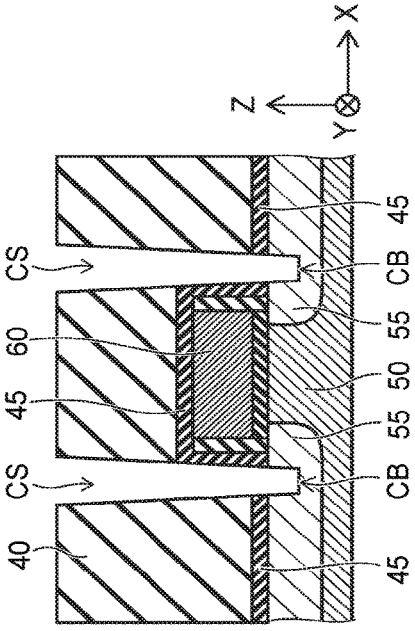
FIGS. 13A to 13D are schematic cross-sectional views showing a method for forming the contact structure according to the third embodiment.

As shown in FIG. 13A, the insulating layer 40 and the insulating layer 45 are formed to cover the source drain region 55 and the gate electrode 60. The insulating layer 40 is, for example, a silicon oxide layer. The insulating layer 45 is, for example, a silicon nitride layer, and is formed between the insulating layer 40 and the source drain region 55 and between the insulating layer 40 and the gate electrode 60.

Figure 13B:
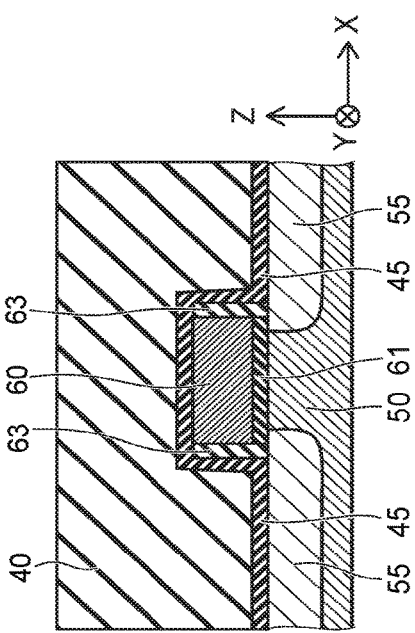

As shown in FIG. 13B, the contact hole CS is formed from the top surface of the insulating layer 40 with a depth capable of reaching the source drain region 55. The contact hole CS is formed, for example, using anisotropic RIE, and the bottom end CB is positioned in the source drain region 55. The contact hole CS is formed at a position close to the gate electrode 60 so that a part of the insulating layer 45, which covers the gate side wall 63 is exposed to the inner wall.

Figure 13C:
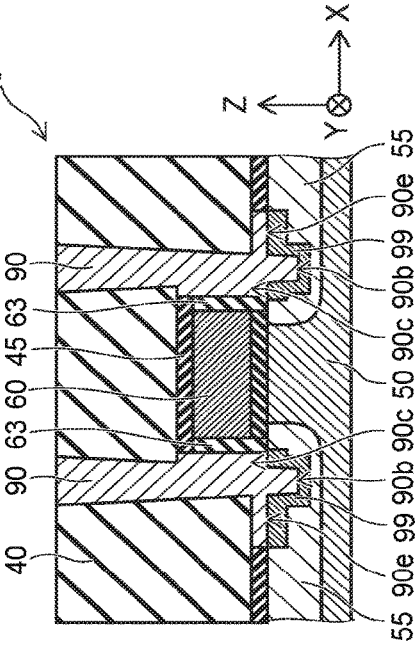

As shown in FIG. 13C, parts of the insulating layer 45 are selectively removed to form a side wall portion CC and the expanded portion CE in the contact hole CS. The side wall portion CC and the expanded portion CE are formed, for example, by selectively removing the insulating layer 45 using wet etching. The side wall portion CC is formed along the gate side wall 63. The expanded portion CE extends in the lateral direction (X-direction, Y-direction) along the surface of the source drain region 55. The gate side wall 63 acts as an etching stopper. Thereby, the side wall portion CC is formed in self-aligned manner on the lateral surface of the gate side wall 63.

Figure 13D:
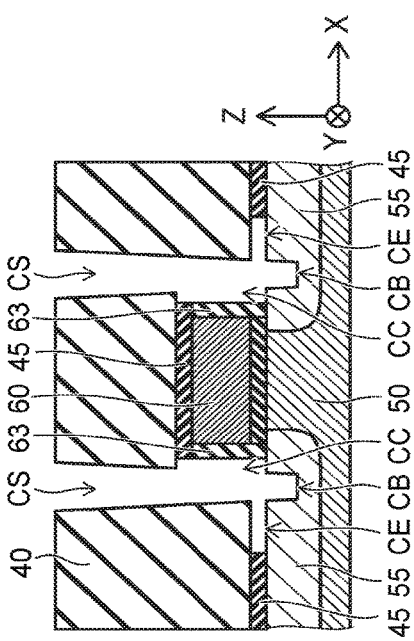

As shown in FIG. 13D, the contact plug 90 is formed in the contact hole CS. The contact plug 90 includes, for example, the barrier metal 71 and the core metal 73 (see FIG. 3B). The contact plug 90 includes the side wall portion 90c that contacts the gate side wall 63, the expanded portion 90e that extends along the surface of the source drain region 55, and the bottom end portion 90b positioned at a level under the expanded portion 90e.

Subsequently, the source drain region 55 and the contact plug 90 are subjected to a heat treatment, and the silicide layer 99 is formed. Also in this example, a portion formed between the source drain region 55 and the expanded portion 90e widens the silicide layer 99 in the lateral direction, and the contact resistance between the source drain region 55 and the contact plug 90 can be reduced.

Since the side wall portion 90c is formed to contact the side surface of the gate side wall 63, an end of silicide locates at a position close to the gate electrode 60, while suppressing variations of the end position of the silicide on the gate electrode 60 side. Thereby, it is possible to reduce parasitic resistance of the source drain region 55 and variations of the parasitic resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a channel body;
a pair of source drain regions provided on the channel body, the pair of source drain regions being separated from each other;
a gate electrode provided above a part of the channel body between the pair of source drain regions;
a gate side wall provided on a side surface of the gate electrode;
a first insulating layer covering the pair of source drain regions, the gate side wall, and the gate electrode;
a plurality of contact bodies extending in the first insulating layer in a first direction from each of the pair of source drain regions toward a top surface of the first insulating layer, the plurality of contact bodies being electrically connected to the pair of source drain regions respectively; and
a silicide layer provided between one of the pair of source drain regions and one of the plurality of contact bodies electrically connected to the one of the pair of source drain regions,
the one of the plurality of contact bodies including a main part extending in the first direction in the first insulating layer, and an expanded portion expanded in a second direction along a surface of the one of the pair of source drain regions, wherein
the expanded portion extends along the surface of the one of the pair of source drain regions, a part of the expanded portion on the gate electrode side extending to a surface of the gate side wall, the surface of the gate side wall being positioned on a side separated from the gate electrode in the second direction, and
the silicide layer is positioned between the expanded portion and the one of the pair of source drain regions.

2. The device according to claim 1, wherein the main part is provided with a columnar shape extending in the first direction.

3. The device according to claim 1, wherein the expanded portion is embedded in the one of the pair of source drain regions.

4. The device according to claim 1, wherein the one of the plurality of contact bodies further includes a bottom end portion positioned at a level under the expanded portion, and
the silicide layer is positioned between the expanded portion and the one of the pair of source drain regions, and between the bottom end portion and the one of the pair of source drain regions.

5. The device according to claim 1, wherein the main part includes a portion expanding to the gate side wall.

6. The device according to claim 1, wherein the one of the plurality of contact bodies includes a core metal and a barrier metal, the barrier metal contacting the silicide layer.

7. The device according to claim 6, wherein the core metal includes tungsten, and
the barrier metal and the silicide layer include titanium.

8. The device according to claim 1, further comprising:
other silicide layer provided between the other of the pair of source drain regions and other one of the plurality of contact bodies, the other one of the plurality of contact bodies being electrically connected to the other of the pair of source drain regions, wherein
the other one of the plurality of contact bodies includes other main part extending in the first direction in the first insulating layer and other expanded portion expanded in the second direction, and
the other silicide layer is positioned between the other expanded portion and the other of the pair of source drain regions.

9. The device according to claim 1, wherein
the plurality of contact bodies include a plurality of first contact bodies electrically connected to the one of the pair of source drain regions, and
the silicide layer extends between the one of the pair of source drain regions and the plurality of first contact bodies.

10. The device according to claim 9, wherein the plurality of first contact bodies are disposed along an extending direction of the gate electrode.

11. The device according to claim 1, further comprising:
a stacked body including a plurality of word lines stacked in the first direction and a semiconductor layer extending through the plurality of word lines in the first direction, wherein
the first insulating layer covers the channel body disposed around the stacked body.

12. The device according to claim 11, wherein the top surface of the first insulating layer is positioned at a level substantially same as a top surface of the stacked body.

* * * * *